(12) United States Patent
Park et al.

(10) Patent No.: US 11,672,105 B2
(45) Date of Patent: Jun. 6, 2023

(54) DATA CENTER COOLING USING A HEAT PIPE

(71) Applicant: Meta Platforms, Inc., Menlo Park, CA (US)

(72) Inventors: Seung H. Park, Fremont, CA (US); Marco Antonio Magarelli, Sunnyvale, CA (US); Veerendra Prakash Mulay, Dublin, CA (US); David Abad Cenizal, Saratoga, CA (US); Jacob Na, Los Gatos, CA (US); Sarah E. Hanna, San Jose, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 0 days.

(21) Appl. No.: 17/127,611

(22) Filed: Dec. 18, 2020

(65) Prior Publication Data

US 2021/0227725 A1     Jul. 22, 2021

Related U.S. Application Data

(60) Provisional application No. 62/961,903, filed on Jan. 16, 2020.

(51) Int. Cl.
*H05K 7/20* (2006.01)

(52) U.S. Cl.
CPC ..... *H05K 7/20827* (2013.01); *H05K 7/20336* (2013.01); *H05K 7/20745* (2013.01)

(58) Field of Classification Search
CPC . H05K 7/20827; H05K 7/20745; H05K 7/208
See application file for complete search history.

(56) References Cited

U.S. PATENT DOCUMENTS

| | | | |
|---|---|---|---|
| 7,505,269 B1 * | 3/2009 | Cosley | F28D 15/0275 165/104.33 |
| 7,903,404 B2 * | 3/2011 | Tozer | H05K 7/20827 62/118 |

(Continued)

FOREIGN PATENT DOCUMENTS

| | | |
|---|---|---|
| EP | 2198682 | 6/2010 |
| JP | 2010210193 | 9/2010 |

(Continued)

OTHER PUBLICATIONS

European Search Opinion for counterpart application EP 21151819. dated Sep. 1, 2021.*

(Continued)

*Primary Examiner* — Zachary Pape
(74) *Attorney, Agent, or Firm* — Van Pelt, Yi & James LLP

(57) ABSTRACT

In one example, a heat pipe is configured to absorb and transfer heat away from ambient air of a data center to cool the ambient air circulating in the data center to cool devices of the data center, and a fluid interface is thermally coupled to the heat pipe and configured to cool the heat pipe via a coolant fluid circulating in the data center. In another example, a heat pipe configured to release transferred heat to air, and a fluid interface is thermally coupled to the heat pipe and configured to exchange heat to the heat pipe to cool a coolant fluid circulating in a data center to cool devices of the data center.

13 Claims, 15 Drawing Sheets

(56) References Cited

U.S. PATENT DOCUMENTS

| | | | | |
|---|---|---|---|---|
| 7,907,395 | B2 * | 3/2011 | Weber | H05K 7/20818 |
| | | | | 361/679.48 |
| 8,441,789 | B2 * | 5/2013 | Wu | H05K 7/208 |
| | | | | 361/698 |
| 10,605,541 | B1 * | 3/2020 | Zheng | F28D 20/028 |
| 10,617,040 | B2 * | 4/2020 | Jing | H05K 7/20745 |
| 11,089,720 | B2 * | 8/2021 | Klaba | H05K 7/20209 |
| 2003/0094266 | A1 * | 5/2003 | Fritsch | H05K 7/206 |
| | | | | 165/104.34 |
| 2011/0067843 | A1 * | 3/2011 | Vasiliev, Jr. | H01L 23/427 |
| | | | | 165/104.26 |
| 2012/0106073 | A1 | 5/2012 | Wu | |
| 2012/0227935 | A1 * | 9/2012 | Huang | B21D 41/04 |
| | | | | 29/890.032 |
| 2017/0131545 | A1 | 5/2017 | Wall et al. | |
| 2020/0043391 | A1 | 2/2020 | Maimone et al. | |

FOREIGN PATENT DOCUMENTS

| | | | | | |
|---|---|---|---|---|---|
| JP | 2011220633 | A | * | 11/2011 | F28D 15/02 |
| JP | 2015021625 | A | * | 2/2015 | |
| JP | 2015021633 | | | 2/2015 | |
| WO | 2009045281 | | | 4/2009 | |

OTHER PUBLICATIONS

Partial European Search Report for European Application No. EP21151819.6, dated Jun. 1, 2021, 13 Pages.

Invitation to Pay Additional Fees for International Application No. PCT/US2021/051155, dated Jan. 11, 2022, 9 pages.

International Search Report and Written Opinion for International Application No. PCT/US2021/051155, dated Mar. 4, 2022, 12 pages.

* cited by examiner

DATA CENTER COOLING USING A HEAT PIPE

CROSS REFERENCE TO OTHER APPLICATIONS

This application claims priority to U.S. Provisional Patent Application No. 62/961,903 entitled DATA CENTER COOLING USING A HEAT PIPE filed Jan. 16, 2020 which is incorporated herein by reference for all purposes.

BACKGROUND OF THE INVENTION

Computer servers, network equipment, and other devices in a data center produce heat while operating. This heat needs to be removed to allow the data center devices to function properly. The performance of the data center is affected by its operating temperature. If components are not being cooled sufficiently, they often do not perform as well. Data centers are often organized into rows of racks that contain electronic devices that generate heat. The heat can significantly degrade the performance of the data center, e.g., causing request handling to be slow, consuming large amounts of energy, and causing components to malfunction prematurely. Existing data center cooling solutions often consume large amounts of power and water resources. There exists a need for a more efficient cooling solution for data centers.

BRIEF DESCRIPTION OF THE DRAWINGS

Various embodiments of the invention are disclosed in the following detailed description and the accompanying drawings.

DETAILED DESCRIPTION

Figure 1A:
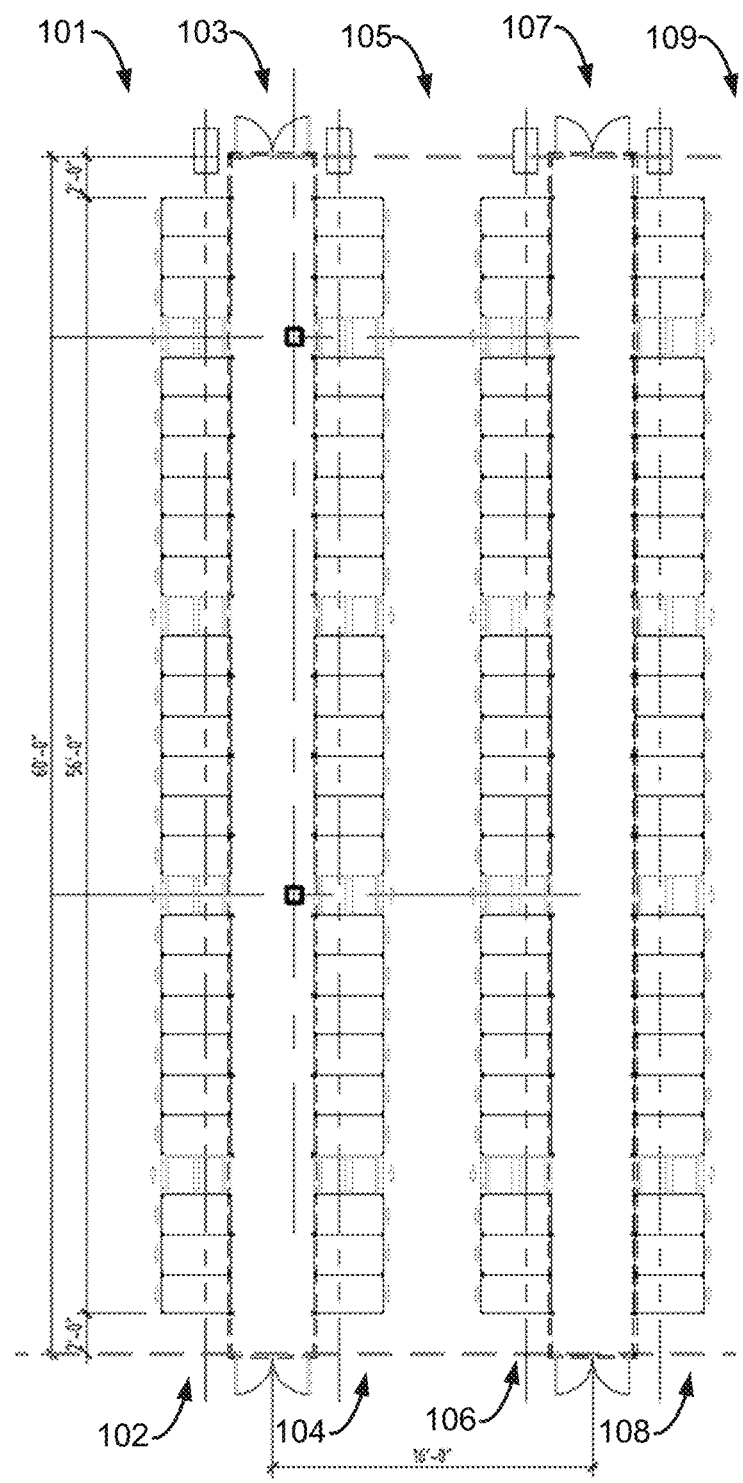
FIG. 1A is a diagram illustrating an overhead view of an example of data center aisles.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A heat pipe can transfer heat from a heat source to another place where it can be dissipated. For example, using principles of thermal conductivity, evaporative cooling, and/or phase transition, the heat pipe transfers heat from one thermal interface to another thermal interface. Heat can be transferred from one thermal interface to another thermal interface of the heat pipe when a liquid within the heat pipe and in contact with the warmer thermal interface turns into vapor and absorbs heat from the warmer thermal interface. This vapor is routed within the heat pipe to the other thermal interface where it can release the heat and cool, allowing the vapor to condense back into a liquid that travels back to the other initial warmer thermal interface to repeat the cycle. Heat pipes have been deployed in small scale electronic devices to transfer heat away from heat producing processors to heat sinks. Going beyond small scale use, in some embodiments, heat pipes are deployed at a larger scale within a data center. For example, as compared to typical mechanical air cooling, it may be more energy efficient to utilize heat pipes to cool a data center due to its efficiency in transferring heat away from the air. In another example, as compared to typical liquid cooling, drastic reduction in water utilization may be achieved with the use of heat pipes by reducing or eliminating the use of evaporative cooling typically found in liquid cooling systems of data centers.

In some embodiments, a heat pipe is configured to absorb and transfer heat away from ambient air of a data center to cool the ambient air circulating in the data center to cool devices of the data center, and a fluid interface is thermally coupled to the heat pipe and configured to cool the heat pipe via a coolant fluid circulating in the data center. For example, an air-to-liquid heat exchanger includes a heat pipe that transfers heat from air flowing over the heat exchanger to a coolant fluid. In some embodiments, a heat pipe configured to release transferred heat to air, and a fluid interface is thermally coupled to the heat pipe and configured to exchange heat to the heat pipe to cool a coolant fluid circulating in a data center to cool devices of the data center. For example, a liquid-to-air heat exchanger includes a heat pipe that transfers heat from a coolant fluid to an outdoor airstream flowing over the heat exchanger. In some embodiments, a first heat pipe is configured to absorb and transfer heat away from ambient air of a data center to cool the ambient air circulating in the data center to cool devices of the data center, and a second heat pipe is thermally coupled to the first heat pipe and configured to release the transferred heat to cool the first heat pipe. For example, an air-to-air heat exchanger system includes heat pipes that effectively transfer heat from one to another.

Figure 1B:
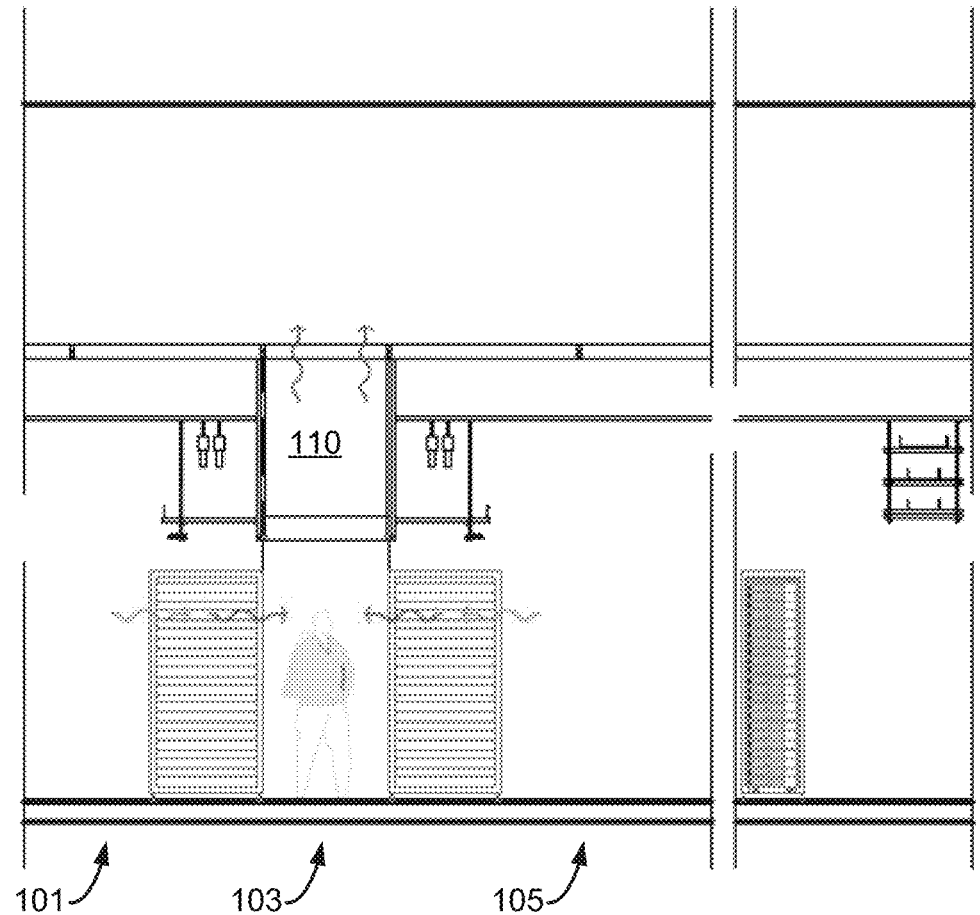
FIG. 1B is a diagram illustrating a side view of an example of data center aisles.

FIG. 1A is a diagram illustrating an overhead view of an example of data center aisles. FIG. 1B is a diagram illustrating a side view of an example of data center aisles. Networking, storage, computing, power, and server devices in data center racks/cabinets (e.g., switches, routers, network attached storage, processors, machine learning processors, power supplies, battery backup, etc.) in row 102 take in cooled air from cold-aisle 101 and exhaust warmed air into hot-aisle 103. Devices in row 104 take in cooled air from cold-aisle 105 and exhaust warmed air into hot-aisle 103. Devices in row 106 take in cooled air from cold-aisle 105 and exhaust warmed air into hot-aisle 107. Devices in row 108 take in cooled air from cold-aisle 109 and exhaust warmed air into hot-aisle 107. Warm air in hot-aisle 103 is drawn up into an overhead plenum 110 where it can be further directed to be expelled out of the data center and/or be cooled and returned back to the cold-aisles.

Figure 2A:
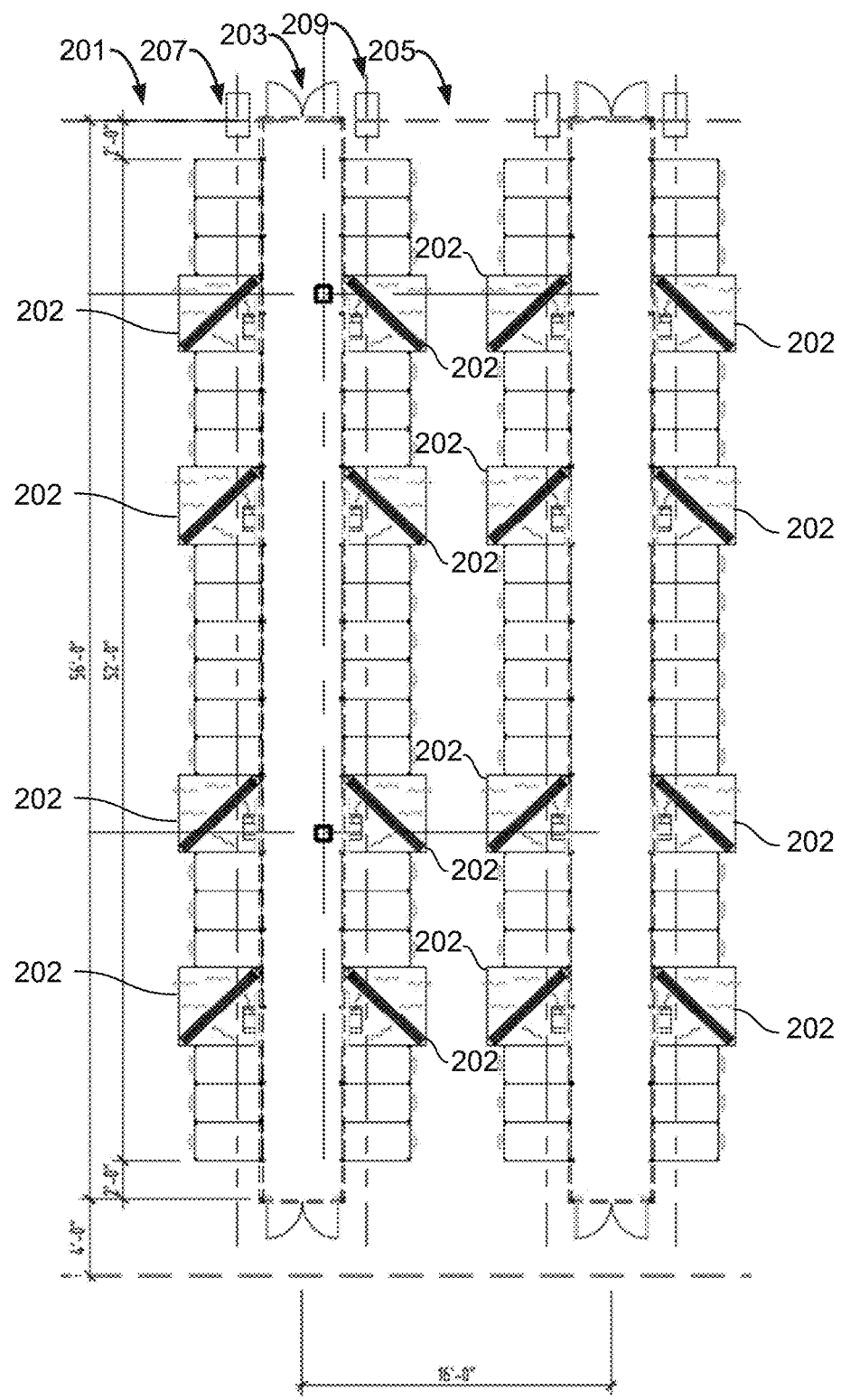
FIG. 2A is a diagram illustrating an overhead view of an embodiment of a data center with in-row heat pipe heat exchanger units.

FIG. 2A is a diagram illustrating an overhead view of an embodiment of a data center with in-row heat pipe heat exchanger units. In-row heat pipe heat exchanger units 202 are placed within the rows of device racks/cabinets of the data center. For example, a chassis housing an in-row heat pipe heat exchanger unit is placed in the same line of racks/cabinets forming a row within the data center. These in-row heat pipe heat exchanger units include one or more heat pipes that absorb and transfer heat away from air of a hot aisle of the data center to cool the air and return the cooled air back to a cold aisle of the data center. As shown in FIG. 2A, each of in-row heat pipe heat exchanger units 202 includes a heat exchanger (e.g., air-to-liquid heat exchanger) placed diagonally within a box chassis of the unit (e.g., to maximize side area facing aisles). Air passing over a first thermal interface of the heat pipe of the heat pipe heat exchanger unit and/or an air interface component (e.g., thermally conductive metal fins) thermally coupled to the first thermal interface is cooled by the first thermal interface and/or the air interface component. The heat pipe carries heat away from the first thermal interface to a different second thermal interface of the heat pipe thermally coupled to a fluid interface component (e.g., heat pipe to liquid heat exchanger) configured to interface with a circulating coolant fluid that carries away the heat from the heat pipe to cool the heat pipe. For example, air from cold aisles 201 and 205 is drawn in and warmed by computing devices in rows 207 and 209, respectively, and forced into hot aisle 203. Hot air from hot aisle 203 passes through the air interface component of in-row heat pipe heat exchanger units 202 in row 207 and becomes cooled and exits into cold aisle 201 to repeat the air exchange cycle. Hot air from hot aisle 203 also passes through the air interface component of in-row heat pipe heat exchanger units 202 in row 209 and becomes cooled and exits into cold aisle 205.

Figure 2B:
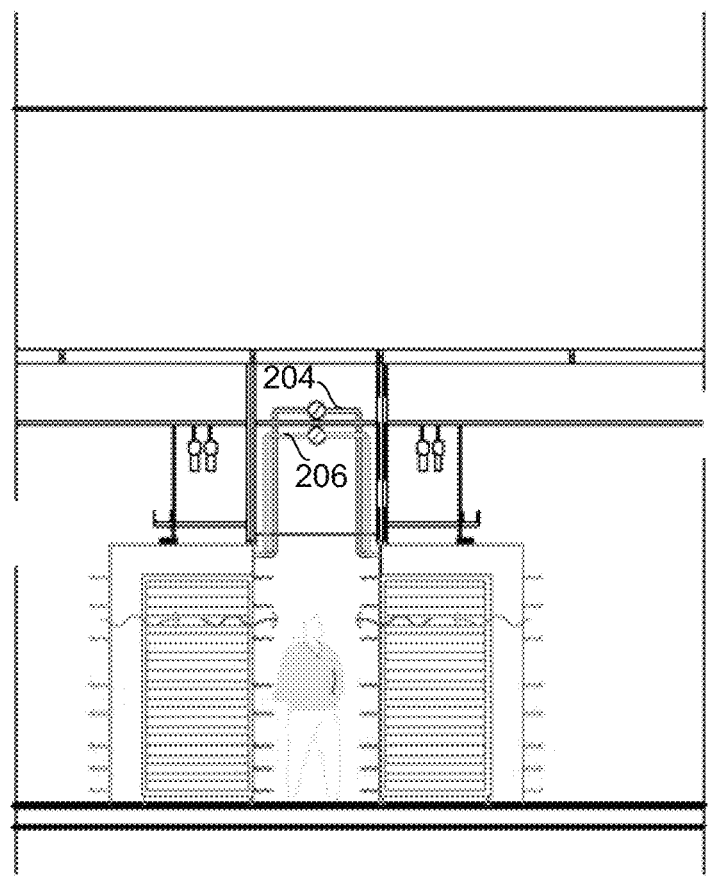
FIG. 2B is a diagram illustrating a side view of the embodiment of the data center with the in-row heat pipe heat exchanger units of FIG. 2A.

FIG. 2B is a diagram illustrating a side view of the embodiment of the data center with the in-row heat pipe heat exchanger units of FIG. 2A. The heat absorbed by in-row heat pipe heat exchanger units 202 of FIG. 2A from the air passing over the air interface components is transferred by the included heat pipes (e.g., via thermal conductivity, evaporative cooling, and/or phase transition within the heat pipes) to other thermal interfaces for liquid cooling. For example, the heat pipe is connected to the fluid interface component interfacing with a circulating coolant fluid. The coolant fluid warmed by heat carried by the heat pipes is pumped away (e.g., via hot fluid pipeline 204 connected to the in-row heat pipe heat exchanger units) to be cooled and returned back for continual cooling (e.g., via cold fluid pipeline 206 connected to the in-row heat pipe heat exchanger units). The cooling of the coolant fluid may be achieved via another heat pipe heat exchanger and/or mechanically cooled via a refrigerant and/or evaporative cooling.

Figure 3A:
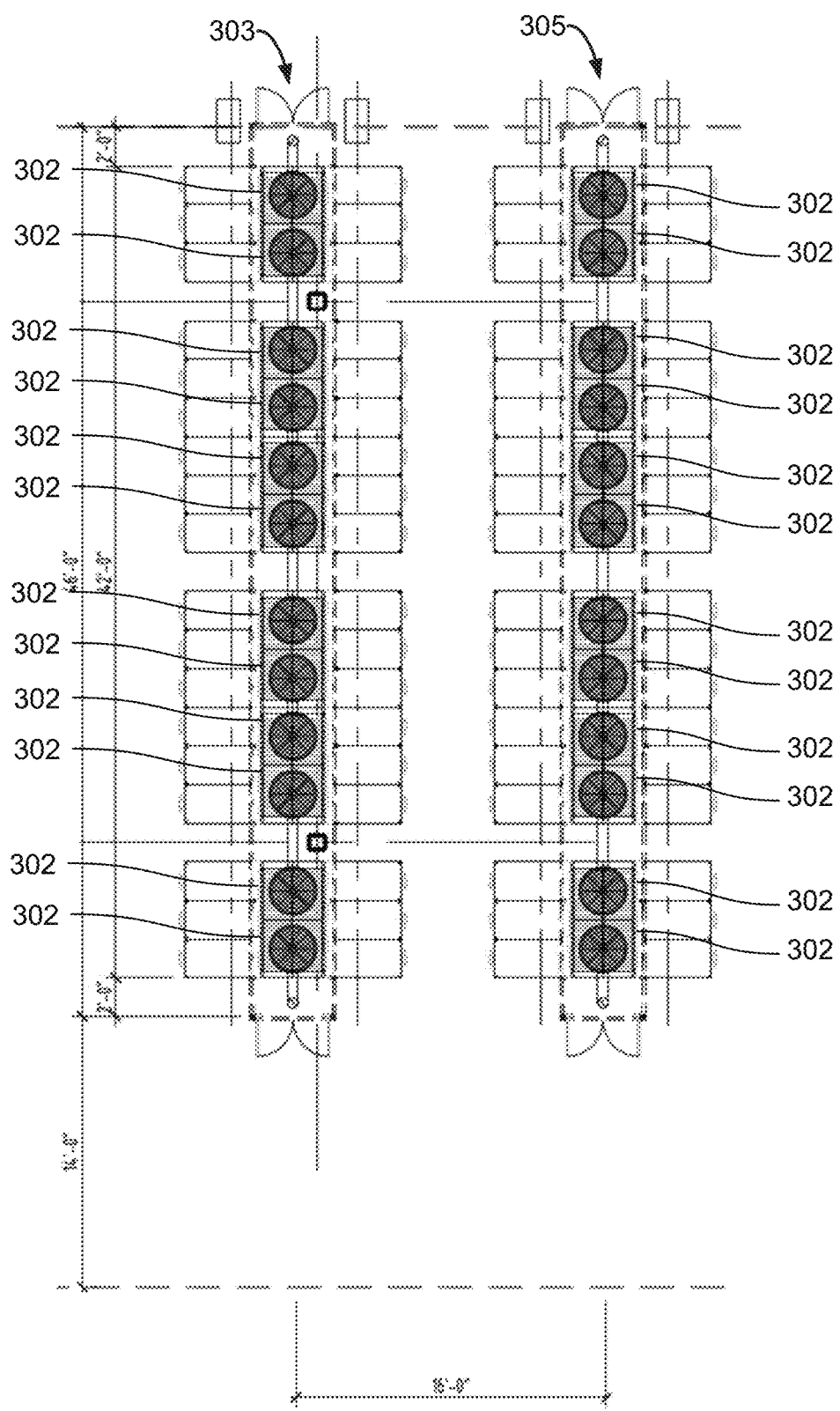
FIG. 3A is a diagram illustrating an overhead view of an embodiment of a data center with overhead heat pipe heat exchanger units.
Figure 3B:
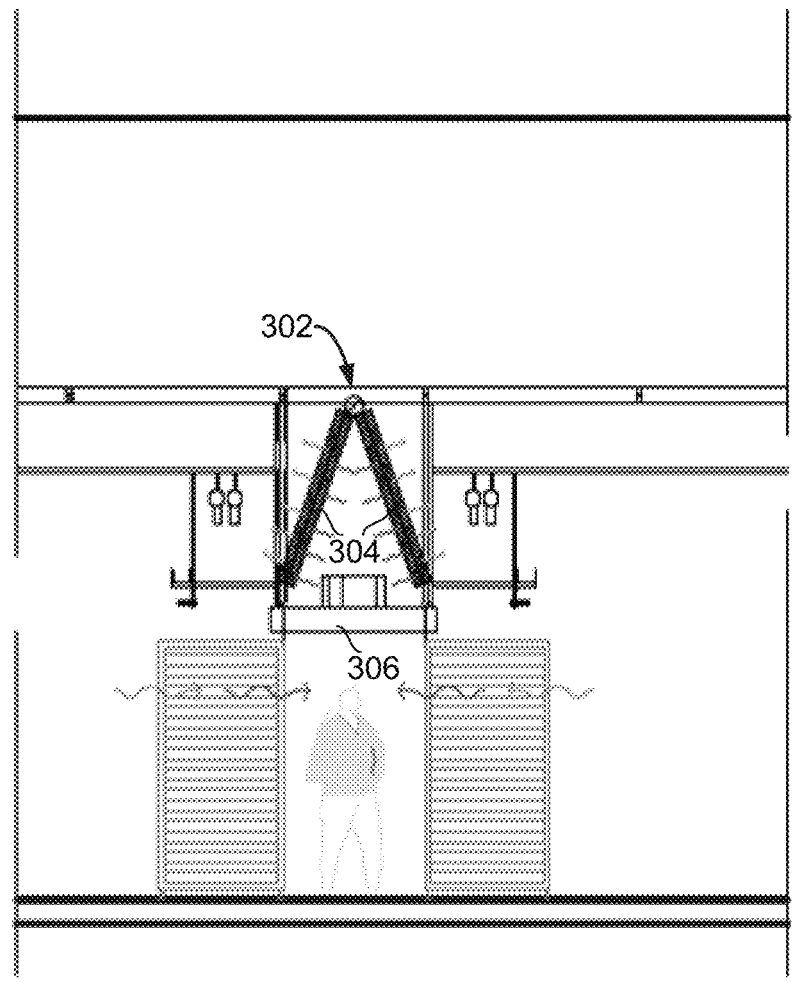
FIG. 3B is a diagram illustrating a side view of an embodiment of the data center with the overhead heat pipe heat exchanger units of FIG. 3A.

FIG. 3A is a diagram illustrating an overhead view of an embodiment of a data center with overhead heat pipe heat exchanger units. FIG. 3B is a diagram illustrating a side view of an embodiment of the data center with the overhead heat pipe heat exchanger units of FIG. 3A. Overhead heat pipe heat exchanger units 302 are placed in overhead space of hot aisles 303 and 305 of the data center. As shown, the overhead heat pipe heat exchanger units are placed above and in lines along the length of the hot aisles. These overhead heat pipe heat exchanger units include one or more heat pipes that absorb and transfer heat away from air of a hot aisle of the data center to cool the air and return the cooled air back to cold aisles of the data center. As shown in FIG. 3B, each of overhead heat pipe heat exchanger units 302 includes heat exchanger 304 (e.g., air-to-liquid heat exchanger) that has sections arranged at an angle from one another to form a V-shape (e.g., with point on top and opening of the V on the bottom), which allows maximization of the side area facing the hot aisle below within a limited amount of vertical height available in the overhead space. Air passing over a first thermal interface of the heat pipe of heat exchanger 304 and/or an air interface component (e.g., fins) thermally coupled to the first thermal interface is cooled by the first thermal interface and/or the air interface component. The heat pipe carries heat away from the first thermal interface to a different second thermal interface of the heat pipe thermally coupled to a fluid interface component (e.g., heat pipe to liquid heat exchanger) configured to interface with a circulating coolant fluid that carries away the heat from the heat pipe to cool the heat pipe. For example, air from a cold aisle is drawn in and warmed by computing devices forced into a hot aisle. Air from the hot aisle below is drawn in via fan 306 of unit 302 and passes through the air interface component of heat exchanger 304 and becomes cooled and exits into a plenum where the cooled air is channeled back via ducts to cold aisles, where the cycle is then repeated.

The heat absorbed by overhead heat pipe heat exchanger units 302 from the air passing over the air interface components is transferred by the included heat pipes (e.g., via thermal conductivity, evaporative cooling, and/or phase transition within the heat pipes) to other thermal interfaces for liquid cooling. For example, the heat pipe is connected to the fluid interface component interfacing with a circulating coolant fluid. The coolant fluid warmed by heat carried by the heat pipes is pumped away to be cooled and returned back for continual cooling. The cooling of the coolant fluid may be achieved via another heat pipe heat exchanger and/or mechanically cooled via a refrigerant and/or evaporative cooling.

Figure 4A:
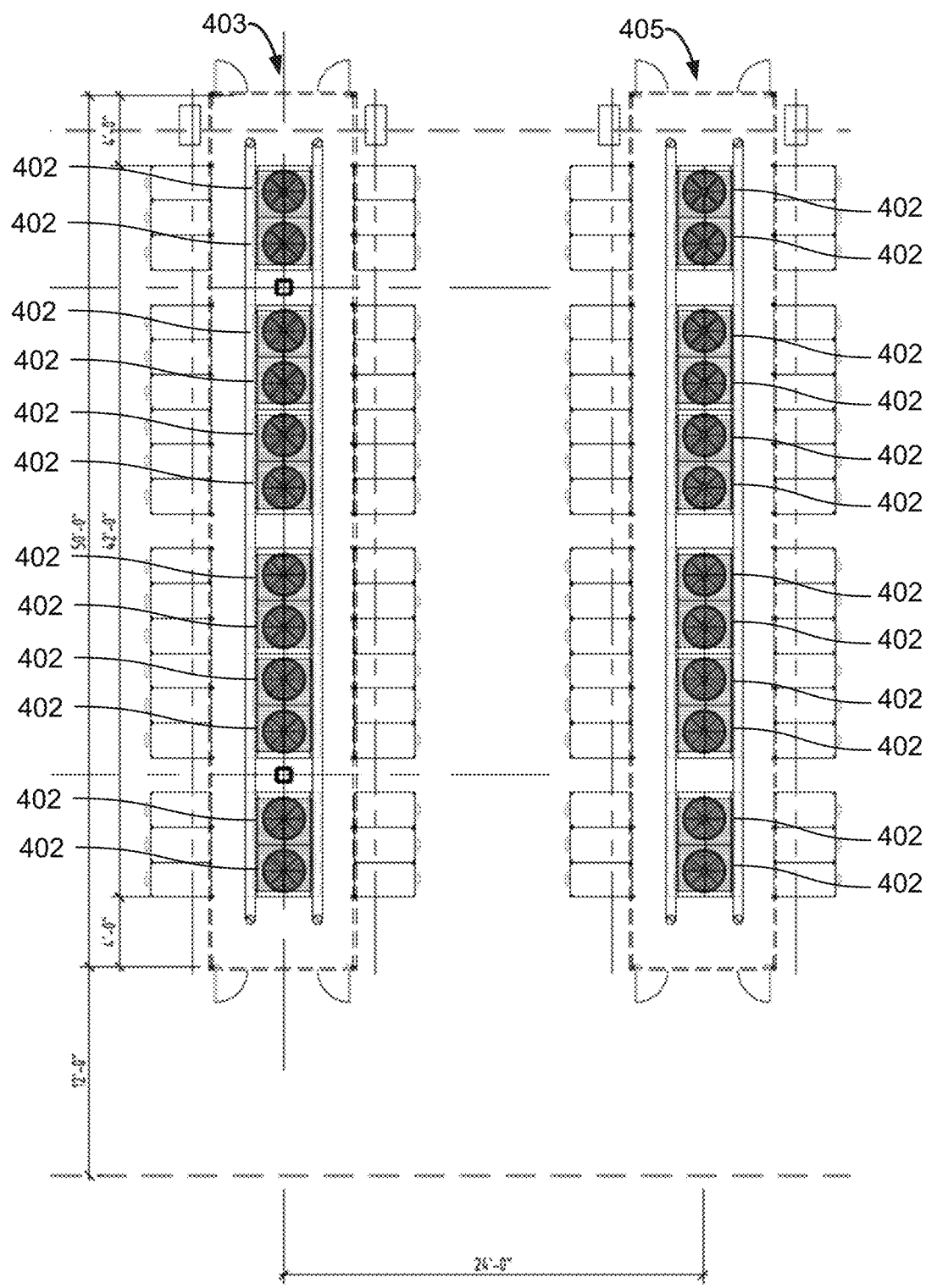
FIG. 4A is a diagram illustrating an overhead view of an embodiment of a data center with in-hot-aisle heat pipe heat exchanger units.
Figure 4B:
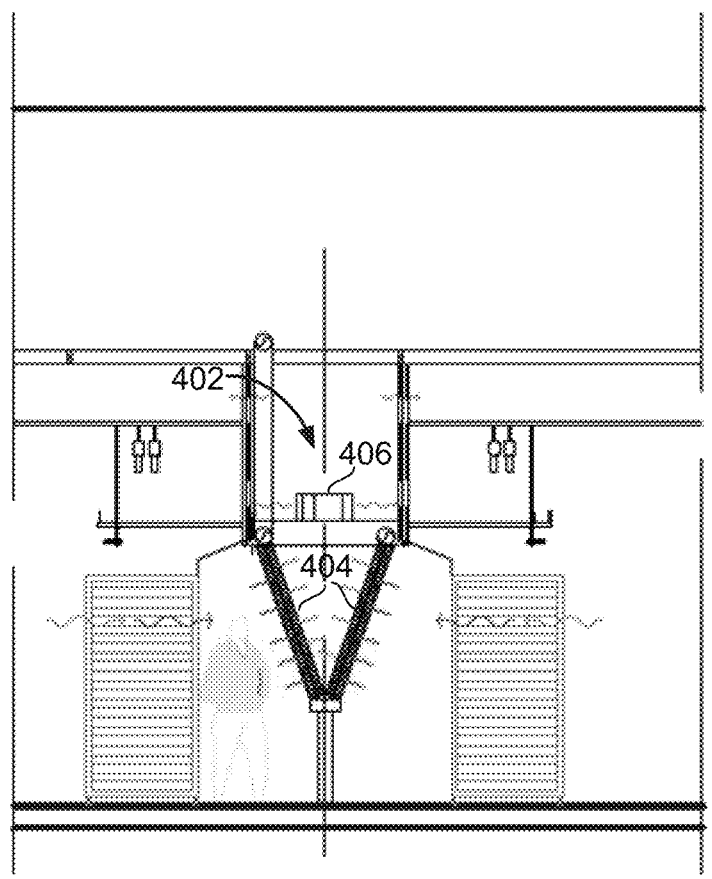
FIG. 4B is a diagram illustrating a side view of an embodiment of the data center with the in-hot-aisle heat pipe heat exchanger units of FIG. 4A.

FIG. 4A is a diagram illustrating an overhead view of an embodiment of a data center with in-hot-aisle heat pipe heat exchanger units. FIG. 4B is a diagram illustrating a side view of an embodiment of the data center with the in-hot-aisle heat pipe heat exchanger units of FIG. 4A. In-hot-aisle heat pipe heat exchanger units 402 are placed within hot aisles 403 and 405 of the data center. As shown, the in-hot-aisle heat pipe heat exchanger units are placed within and in lines along the length of hot aisles. Although these in-hot-aisle heat pipe heat exchanger units take up space within a hot aisle, this may allow them to be larger and allow easier installation and maintenance since they are more easily reachable by not being in an overhead space. These in-hot-aisle heat pipe heat exchanger units include one or more heat pipes that absorb and transfer heat away from air of a hot aisle of the data center to cool the air and return the cooled air back to cold aisles of the data center. As shown in FIG. 4B, each of in-hot-aisle heat pipe heat exchanger units 402 includes heat exchanger 404 (e.g., air-to-liquid heat exchanger) that has sections arranged at an angle from one another to form a V-shape (e.g., with point on bottom and opening of the V on the top), which may allow the side area facing the hot aisle to be increased as compared to a flat single slab design. Air passing over a first thermal interface of the heat pipe of heat exchanger 404 and/or an air interface component (e.g., fins) thermally coupled to the first thermal interface is cooled by the first thermal interface and/or the air interface component. The heat pipe carries heat away from the first thermal interface to a different second thermal interface of the heat pipe thermally coupled to a fluid interface component (e.g., heat pipe to liquid heat exchanger) configured to interface with a circulating coolant fluid that carries away the heat from the heat pipe to cool the heat pipe. For example, air from a cold aisle is drawn in and warmed by computing devices forced into a hot aisle. Air from the hot aisle is drawn in to in-hot-aisle heat pipe heat exchanger unit 402 via its fan 406, and the drawn hot air passes through the air interface component of heat exchanger 404 and becomes cooled and exits into a plenum where the cooled air is channeled back via ducts to cold aisles, where the cycle is then repeated.

The heat absorbed by in-hot-aisle heat pipe heat exchanger units 402 from the air passing over the air interface components is transferred by the included heat pipes (e.g., via thermal conductivity, evaporative cooling, and/or phase transition within the heat pipes) to other thermal interfaces for liquid cooling. For example, the heat pipe is connected to the fluid interface component interfacing with a circulating coolant fluid. The coolant fluid warmed by heat carried by the heat pipes is pumped away to be cooled and returned back for continual cooling. The cooling of the coolant fluid may be achieved via another heat pipe heat exchanger and/or mechanically cooled via a refrigerant and/or evaporative cooling.

Figure 5A:
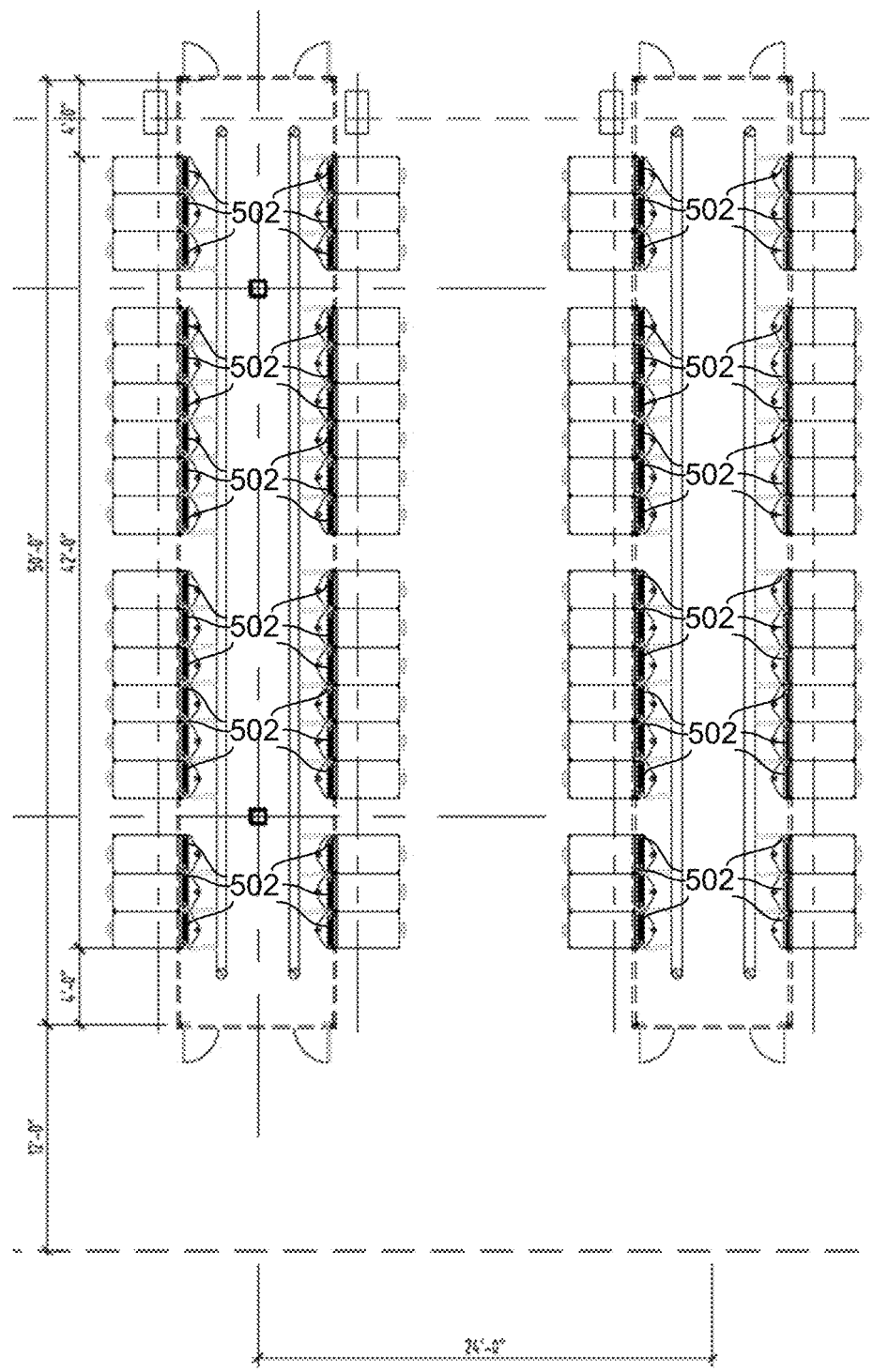
FIG. 5A is a diagram illustrating an overhead view of an embodiment of a data center with rack panel heat pipe heat exchanger units.
Figure 5B:
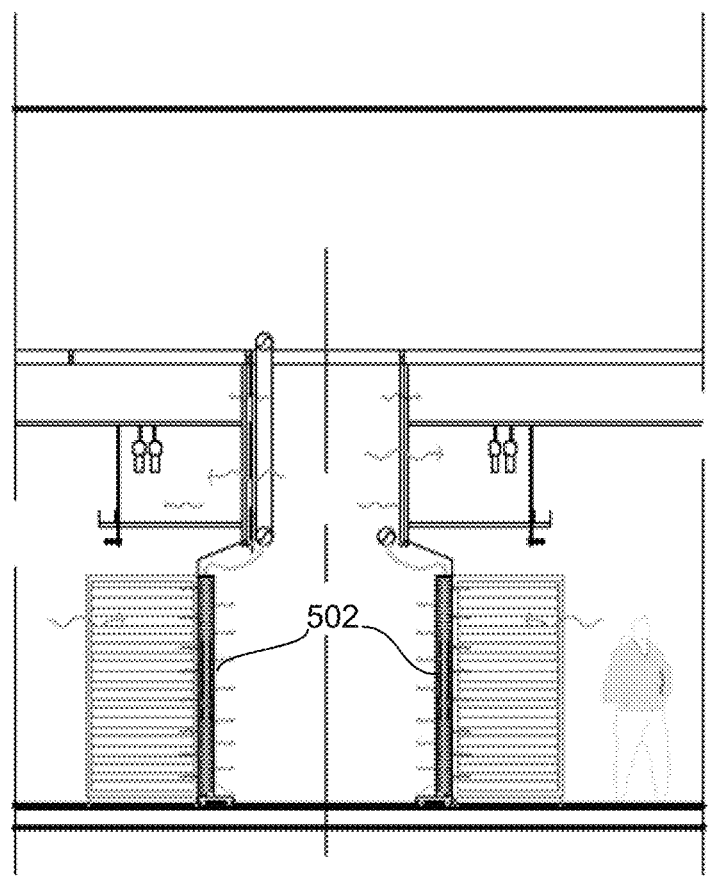
FIG. 5B is a diagram illustrating a side view of an embodiment of the data center with the rack panel heat pipe heat exchanger units of FIG. 5A.

FIG. 5A is a diagram illustrating an overhead view of an embodiment of a data center with rack panel heat pipe heat exchanger units. FIG. 5B is a diagram illustrating a side view of an embodiment of the data center with the rack panel heat pipe heat exchanger units of FIG. 5A. Rack panel heat pipe heat exchanger units 502 are placed behind each data center rack/cabinet. For example, each rack panel heat pipe heat exchanger units 502 is mechanically coupled to the data center rack/cabinet to cover the rear side where air exhausts/exits out. These rack panel heat pipe heat exchanger units include one or more heat pipes that absorb and transfer heat away from hot air exiting the data center racks/cabinets (e.g., exiting exhaust fans of equipment of the data center racks) to immediately cool the hot air and return the cooled air back to an aisle of the data center. Because the air exiting the rack panel heat pipe heat exchanger units has been cooled, air in the traditional "hot-aisle" may not need to be further cooled before returning back to the data center. Air passing over a first thermal interface of the heat pipe of each heat exchanger unit 502 and/or an air interface component (e.g., fins) thermally coupled to the first thermal interface is cooled by the first thermal interface and/or the air interface component. The heat pipe carries heat away from the first thermal interface to a different second thermal interface of the heat pipe thermally coupled to a fluid interface component (e.g., heat pipe to liquid heat exchanger) configured to interface with a circulating coolant fluid that carries away the heat from the heat pipe to cool the heat pipe. The heat absorbed by rack panel heat pipe heat exchanger units 502 from the air passing over the air interface components is transferred by the included heat pipes (e.g., via thermal conductivity, evaporative cooling, and/or phase transition within the heat pipes) to other thermal interfaces for liquid cooling. For example, the heat pipe is connected to the fluid interface component interfacing with a circulating coolant fluid. The coolant fluid warmed by heat carried by the heat pipes is pumped away to be cooled and returned back for continual cooling. The cooling of the coolant fluid may be achieved via another heat pipe heat exchanger and/or mechanically cooled via a refrigerant and/or evaporative cooling.

Figure 6:
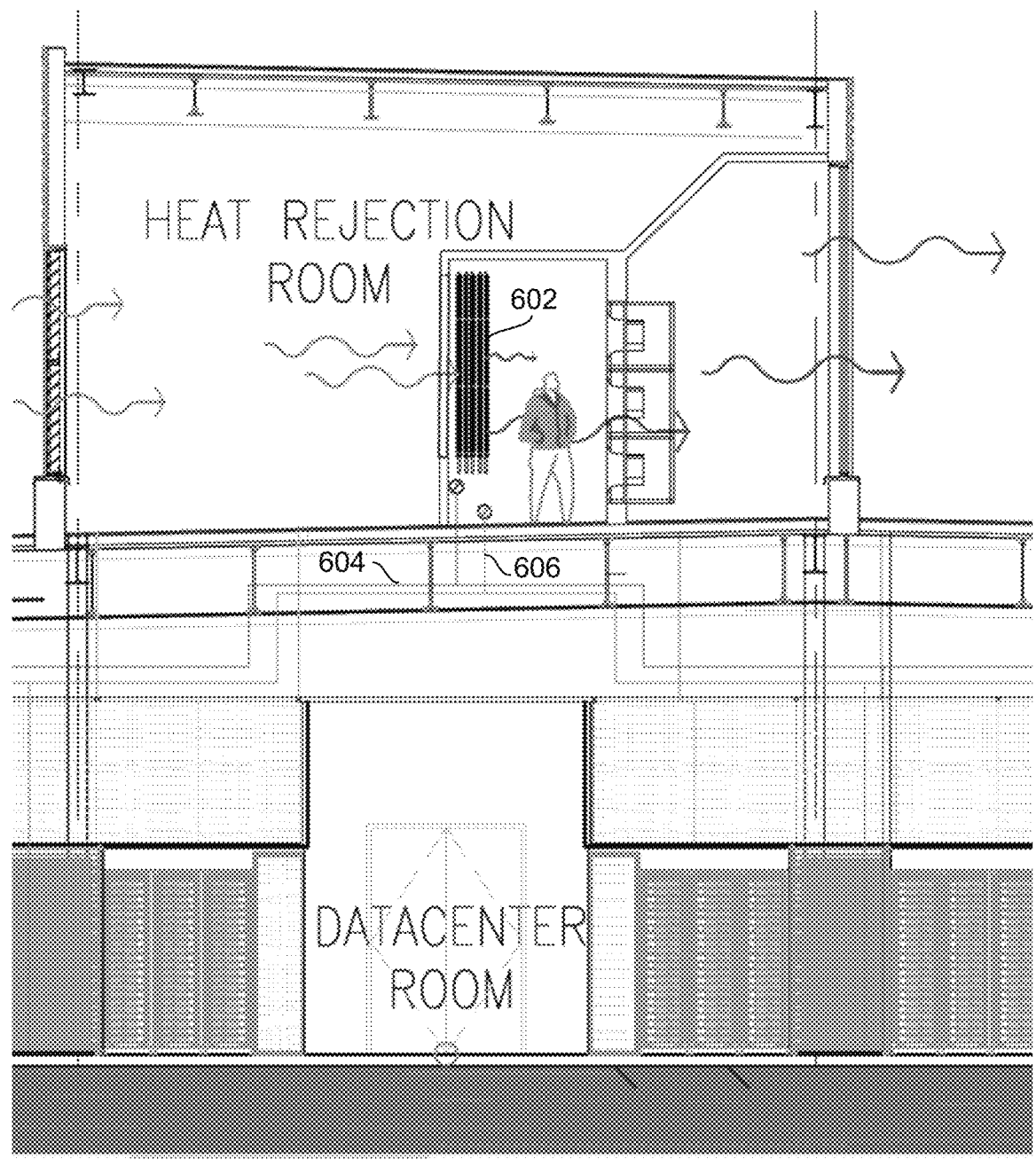
FIG. 6 is a diagram illustrating a side view of an embodiment of a heat rejection room of a data center with a heat pipe heat exchanger.

FIG. 6 is a diagram illustrating a side view of an embodiment of a heat rejection room of a data center with a heat pipe heat exchanger. Heat rejection room heat pipe heat exchanger unit 602 is placed in a heat rejection (e.g., a room above the data center room with data center devices) to remove heat from the data center. Hot fluid pipeline 604 is a part of a liquid cooling system that provides warmed coolant fluid (e.g., warmed after being used to cool data center air) to be cooled using heat pipe heat exchanger unit 602 (e.g., provides fluid carrying heat from other traditional heat exchangers and/or from other in-row heat pipe heat exchanger units 202, overhead heat pipe heat exchanger units 302, in-hot-aisle heat pipe heat exchanger units 402, and/or rack panel heat pipe heat exchanger units 502, etc.). For example, heat rejection room heat pipe heat exchanger unit 602 includes a fluid interface component (e.g., liquid to heat pipe heat exchanger) interfacing with the warmed coolant fluid from hot fluid pipeline 604. The fluid interface component is thermally coupled to a first thermal interface of a heat pipe of the heat rejection room heat pipe heat exchanger unit 602 and cools the warmed coolant fluid via the heat pipe that carries heat away (e.g., via thermal conductivity, evaporative cooling, and/or phase transition within the heat pipe) from the first thermal interface coupled to the fluid interface component to a second thermal interface of the heat pipe. The heat reaching the second thermal interface of the heat pipe is cooled via external cool air or mechanically cooled air that is forced or naturally allowed to flow over the second thermal interface of the heat pipe (e.g., heat pipe coil section) and/or an air interface component (e.g., fins) thermally coupled to the second thermal interface. The coolant fluid cooled by the fluid interface component is returned back via cold fluid pipeline 606 to cool the other heat exchanger units that cool heat originating from devices of the data center.

Figure 7:
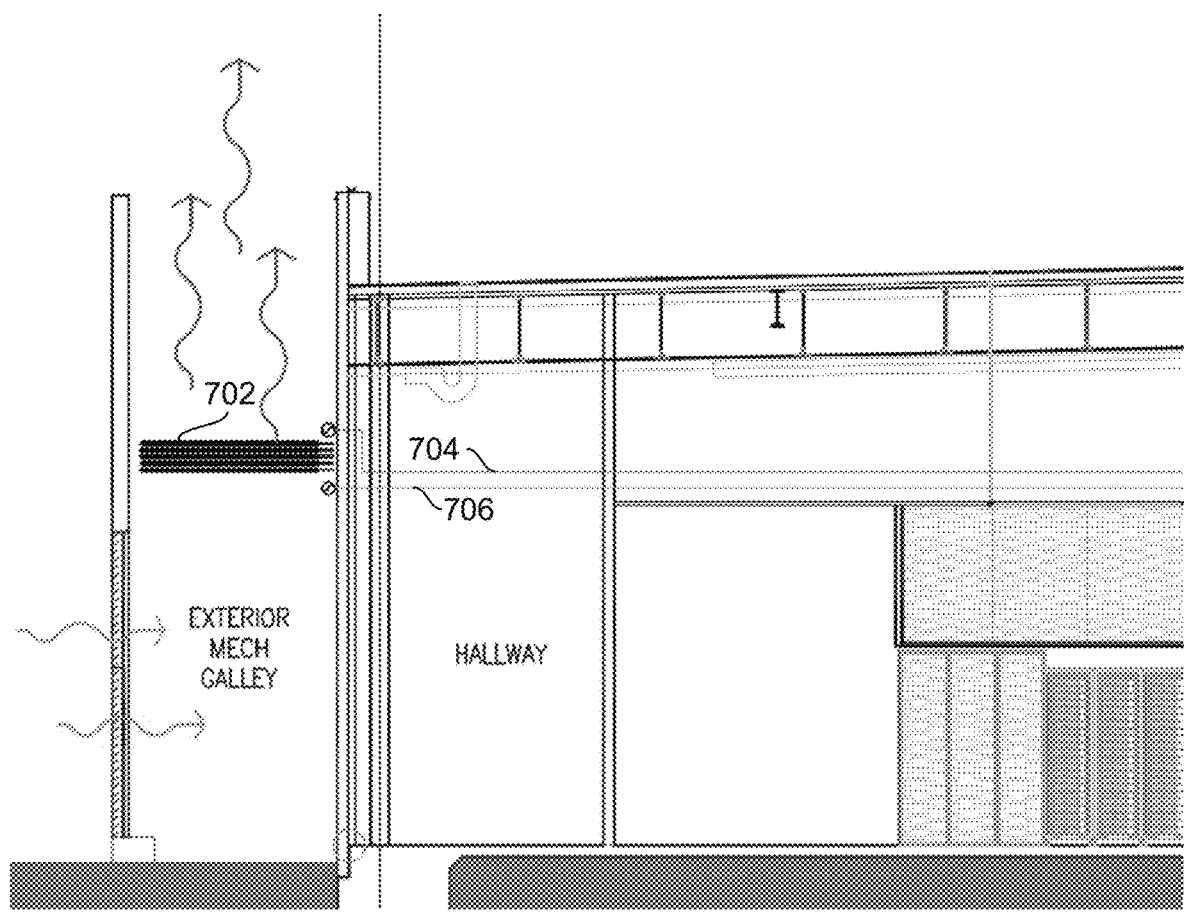
FIG. 7 is a diagram illustrating a side view of an embodiment of a data center using an external heat pipe heat exchanger.

FIG. 7 is a diagram illustrating a side view of an embodiment of a data center using an external heat pipe heat exchanger. External heat pipe heat exchanger unit 702 is directly exposed to the outside and natural flow of air (e.g., via wind and convention), allowing cool outdoor temperatures to be leveraged to remove heat from the data center via external heat pipe heat exchanger unit 702. Hot fluid pipeline 704 is a part of a liquid cooling system that provides warmed coolant fluid (e.g., warmed after being used to cool data center air) to be cooled using heat pipe heat exchanger unit 702 (e.g., provides fluid carrying heat from other traditional heat exchangers and/or from other in-row heat pipe heat exchanger units 202, overhead heat pipe heat exchanger units 302, in-hot-aisle heat pipe heat exchanger units 402, and/or rack panel heat pipe heat exchanger units 502, etc.). For example, external heat pipe heat exchanger unit 702 includes a fluid interface component (e.g., liquid to heat pipe heat exchanger) interfacing with the warmed coolant fluid from hot fluid pipeline 704. The fluid interface component is thermally coupled to a first thermal interface of a heat pipe of the external heat pipe heat exchanger unit 702 and cools the warmed coolant fluid via the heat pipe that carries heat away (e.g., via thermal conductivity, evaporative cooling, and/or phase transition within the heat pipe) from the first thermal interface coupled to the fluid interface component to a second thermal interface of the heat pipe. The heat reaching the second thermal interface of the heat pipe is cooled via external cool air that is allowed to flow over the second thermal interface of the heat pipe (e.g., heat pipe coil section) and/or an air interface component (e.g., fins) thermally coupled to the second thermal interface. By being directly exposed to the outside, external heat pipe heat exchanger 702 is able to take advantage of any naturally occurring cool temperature and wind. The coolant fluid cooled by the fluid interface component is returned back via cold fluid pipeline 706 to cool the other heat exchanger units that cool heat originating from devices of the data center. As shown in FIG. 7, external heat pipe heat exchanger 702 is configured to be horizontally longer than it is vertically taller to allow additional horizontal area for more natural air/heat convection. In some embodiments, external heat pipe heat exchanger unit 702 is selectively utilized based on weather conditions. For example, heat pipe heat exchanger unit 702 is only utilized when criteria (e.g., based on temperature, wind conditions, precipitation, time of day, season, etc.) are met for efficient cooling. Use of heat pipe heat exchanger unit 702 may be selectively turned on and off using one or more valves that selectively allow or not allow coolant fluid to flow via hot fluid pipeline 704 and/or cold fluid pipeline 706. External heat pipe heat exchanger 702 may be used in conjunction with heat rejection room heat pipe heat exchanger unit 602 of FIG. 6 and/or other mechanical cooling (e.g., refrigeration chiller) as a supplemental and/or backup cooling source (e.g., when outdoor condition does not meet criteria for use of external heat pipe heat exchanger 702).

Figure 8A:
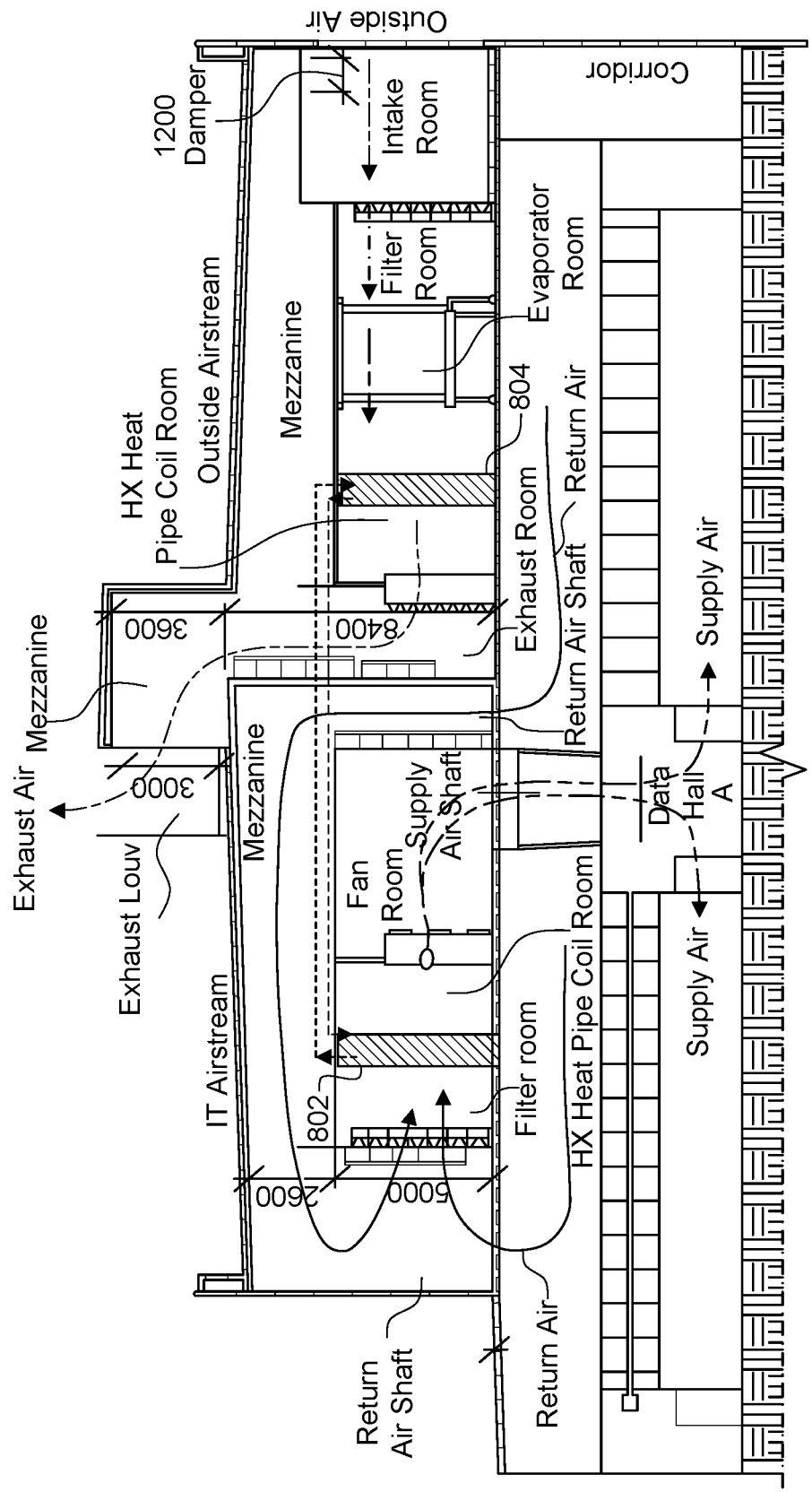
FIG. 8A is a diagram illustrating a side view of an embodiment of a data center with divided mechanical room sections using heat pipe heat exchangers.

FIG. 8A is a diagram illustrating a side view of an embodiment of a data center with divided mechanical room sections using heat pipe heat exchangers. The mechanical room sections of a penthouse of the data center house equipment needed to cool air from a data center floor housing data center devices. The shown penthouse in FIG. 8A is merely an example, and the various shown components and configurations can be utilized in various other embodiments in other types of mechanical rooms of a data center. The penthouse in FIG. 8A has been divided into sections with two distinct functions: left section handles the device cooling airstream and the right section handles the outside airstream.

For the device cooling airstream, warm air (e.g., from hot aisles) warmed by devices in the data center is returned to the left section of the mechanical penthouse via return air plenums and return air shafts to the filter room where the air is filtered. The filtered air is cooled using device airstream heat pipe heat exchanger unit 802, and the cooled air is forced via the supply air shaft to the data center floor (e.g., to cold aisles) for use in cooling devices. Device airstream heat pipe heat exchanger unit 802 includes one or more heat pipes that absorb and transfer heat away from hot air passing over a first thermal interface of the heat pipe and/or an air interface component (e.g., fins) thermally coupled to the first thermal interface of the heat pipe. The heat pipe transfers heat away from the first thermal interface to a different second thermal interface of the heat pipe thermally coupled to a fluid interface component (e.g., heat pipe to liquid heat exchanger). The fluid interface component is configured to interface with a circulating coolant fluid that absorbs and carries away the heat from the second thermal interface to cool the heat pipe. Thus the heat absorbed by device airstream heat pipe heat exchanger unit 802 is transferred by the included heat pipe (e.g., via thermal conductivity, evaporative cooling, and/or phase transition within the heat pipes) to the second thermal interface for liquid cooling. The coolant fluid warmed by the heat of the heat pipe is pumped away and travels through a pipeline to be cooled by the right section of the mechanical penthouse by outside airstream heat pipe heat exchanger unit 804 and returned back via another pipeline for continual cooling of device airstream heat pipe heat exchanger unit 802.

For the outside airstream section, cool outside air enters via a plenum of the intake room and filtered. This filtered air may be optionally further cooled via evaporative cooling in the evaporator room. In various other embodiments, evaporative cooling is not performed. Then the cool air passes over outside airstream heat pipe heat exchanger unit 804 to cool it. The warmed air from outside airstream heat pipe heat exchanger unit 804 is purged to the outside via a dog house louver. Some of this warmed air may optionally be recycled back via one or more dampers to the intake room in the event the outside air is too cold (e.g., freezing outdoor conditions) for direct use in the outside airstream section (e.g., shown in FIG. 8B). Cooling of heat exchanger unit 804 enables indirect rejection of waste heat of the data center via cooling of coolant fluid to be returned to device airstream heat pipe heat exchanger unit 802. Outside airstream heat pipe heat exchanger unit 804 includes a fluid interface component (e.g., liquid to heat pipe heat exchanger) interfacing with the warmed coolant fluid from device airstream heat pipe heat exchanger unit 802. The fluid interface component is thermally coupled to a first thermal interface of a heat pipe of unit 804 and cools the warmed coolant fluid via the heat pipe that carries heat away (e.g., via thermal conductivity, evaporative cooling, and/or phase transition within the heat pipe) from the first thermal interface coupled to the fluid interface component to a second thermal interface of the heat pipe. The heat reaching the second thermal interface of the heat pipe is cooled via the cool air that is allowed to flow over the second thermal interface of the heat pipe (e.g., heat pipe coil section) and/or an air interface component (e.g., fins) thermally coupled to the second thermal interface.

Figure 8B:
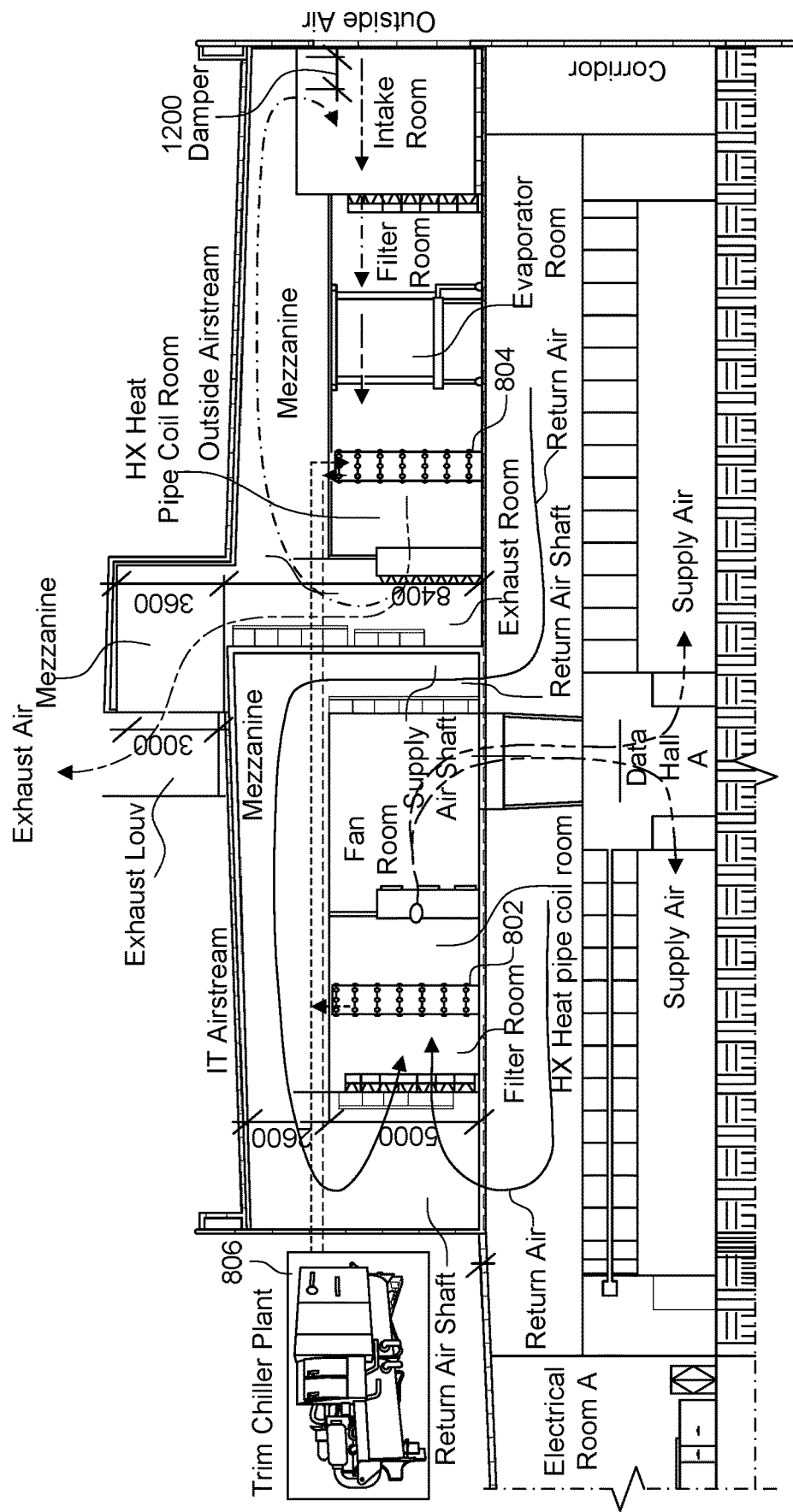
FIG. 8B is a diagram illustrating an alternative embodiment of the data center of FIG. 8A that utilizes an auxiliary cooling source.

FIG. 8B is a diagram illustrating an alternative embodiment of the data center of FIG. 8A that utilizes an auxiliary cooling source. Auxiliary cooling source (e.g., trim chiller plant) 806 is configured to perform mechanical cooling (e.g., refrigerant chilling) of warmed coolant fluid from device airstream heat pipe heat exchanger unit 802. For example, when sufficient cooling of the coolant fluid cannot be achieved by outside airstream heat pipe heat exchanger unit 804 alone, auxiliary cooling source 806 is activated to provide additional cooling of the coolant fluid warmed by unit 802. In some embodiments, heat from auxiliary cooling source 806 is purged via outside airstream heat pipe heat exchanger unit 804 (e.g., warmed coolant fluid from auxiliary cooling source 806 is circulated to unit 804 for cooling).

Figure 9:
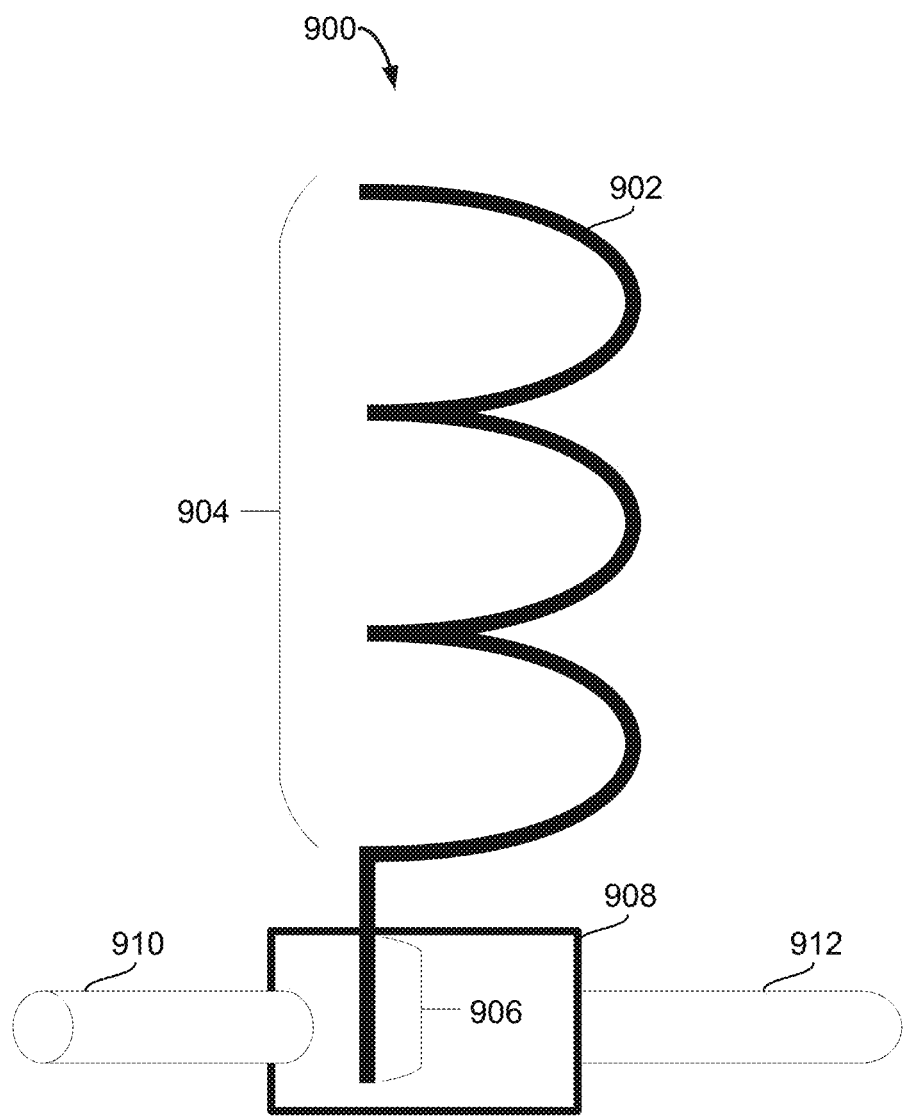
FIG. 9 is a diagram illustrating a simplified schematic of a heat pipe heat exchanger unit.

FIG. 9 is a diagram illustrating a simplified schematic of a heat pipe heat exchanger unit. For example, heat pipe heat exchanger unit 900 is a simplified schematic example of previously discussed heat pipe heat exchanger units 202, 302, 402, 502, 602, 702, 802, and/or 804. Heat pipe heat exchanger unit 900 includes heat pipe 902. The heat pipe can transfer heat from a heat source to another place where it can be dissipated/rejected. For example, using principles of thermal conductivity, evaporative cooling, and/or phase transition, the heat pipe transfers heat from one thermal interface to another thermal interface. Heat can be transferred from one thermal interface to another thermal interface of the heat pipe when a liquid within the heat pipe and in contact with the warmer thermal interface turns into vapor and absorbs heat from the warmer thermal interface. This vapor is routed within the heat pipe to the other thermal interface where it can release the heat and cool, allowing the vapor to condense back into a liquid that travels back to the other initial warmer thermal interface to repeat the cycle. Heat pipe 902 includes first thermal interface section 904 and second thermal interface section 906 and heat is transferred between them. Air may pass over first thermal interface section 904 (e.g., heat pipe coil section) to transfer heat to or away from first thermal interface section 904. In some embodiments, an air interface component is thermally coupled to first thermal interface section 904 to increase the effective air contact surface area. For example, thermally conductive metal fins surround and attach to first thermal interface section 904. Second thermal interface section 906 is thermally coupled to fluid interface component 908. Fluid interface component 908 functions as a heat exchanger between second thermal interface section 906 of heat pipe 902 and fluid provided via input fluid pipeline 910. The fluid cooled or warmed via fluid interface component 908 exits via output fluid input pipeline 912.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a first heat pipe configured to transfer heat away from ambient air of a data center to cool the ambient air circulating in the data center to cool devices of the data center; and
a fluid interface component thermally coupled to the first heat pipe and configured to cool the first heat pipe via a coolant fluid circulating in the data center;
a second heat pipe;
a first pipeline configured to carry the coolant fluid warmed by the first heat pipe to the second heat pipe configured to cool the coolant fluid; and
a second pipeline configured to carry the coolant fluid cooled by the second heat pipe to the first heat pipe configured to transfer the heat away from the ambient air of the data center;
wherein the first heat pipe is entirely within a first room of the data center different from a third room housing the cooled devices of the data center, the second heat pipe is entirely within a second room of the data center different from the first room of the data center and the third room of the data center, and the first pipeline and the second pipeline both cross between the first room and the second room and function simultaneously to exchange heat between the first heat pipe in the first room and the second heat pipe in the second room.

2. The system of claim 1, wherein the first heat pipe is configured to transfer the heat away from the ambient air via a heat pipe coil section of the first heat pipe.

3. The system of claim 1, wherein the first heat pipe is configured to transfer the heat away from the ambient air via a first thermal interface section of the first heat pipe and transfer the heat to a second thermal interface section of the first heat pipe thermally coupled to the fluid interface component.

4. The system of claim 3, wherein the heat transfer between the first thermal interface section and the second thermal interface section is achieved at least in part via a phase transition of a content within the first heat pipe.

5. The system of claim 1, wherein the second heat pipe is configured to cool the coolant fluid via air.

6. The system of claim 1, further including a fan configured to force the ambient air over the first heat pipe.

7. The system of claim 1, wherein the second heat pipe is configured to release the transferred heat to an outdoor airstream separate from the ambient air circulating in the data center.

8. A system, comprising:
a first heat pipe located in a first room of a data center and configured to transfer heat away from ambient air of the data center to cool the ambient air circulating in the data center to cool devices of the data center; and
a second heat pipe located in a second room of the data center different from the first room;
a first pipeline configured to carry a coolant fluid warmed by the first heat pipe to the second heat pipe configured to cool the coolant fluid; and
a second pipeline configured to carry the coolant fluid cooled by the second heat pipe to the first heat pipe configured to transfer heat away from ambient air of the data center;
wherein the first heat pipe is entirely within the first room of the data center different from a third room housing the cooled devices of the data center, the second heat pipe is entirely within the second room of the data center, and the first pipeline and the second pipeline both cross between the first room and the second room and function simultaneously to exchange heat between the first heat pipe in the first room and the second heat pipe in the second room.

9. A system, comprising:
a first heat pipe configured to transfer heat away from ambient air of a data center to cool the ambient air circulating in the data center to cool devices of the data center; and
a second heat pipe;
a first pipeline configured to carry a coolant fluid warmed by the first heat pipe to the second heat pipe configured to cool the coolant fluid; and
a second pipeline configured to carry the coolant fluid cooled by the second heat pipe to the first heat pipe configured to transfer heat away from ambient air of the data center;
wherein the first heat pipe is entirely within a first room of the data center different from a third room housing the cooled devices of the data center, the second heat pipe is entirely within a second room of the data center different from the first room of the data center and the third room of the data center, and the first pipeline and the second pipeline both cross between the first room and the second room and function simultaneously to exchange heat between the first heat pipe in the first room and the second heat pipe in the second room.

10. The system of claim 9, wherein the first heat pipe is configured to transfer the heat away from the ambient air via a heat pipe coil section of the first heat pipe.

11. The system of claim 9, wherein the first heat pipe is configured to transfer the heat away from the ambient air via a first thermal interface section of the first heat pipe and transfer the heat to a second thermal interface section of the first heat pipe.

12. The system of claim 11, wherein the heat transfer between the first thermal interface section and the second thermal interface section is achieved at least in part via a phase transition of a content within the first heat pipe.

13. The system of claim 9, wherein the second heat pipe is configured to cool the coolant fluid via air.

* * * * *